(12) United States Patent
Maliakal

(10) Patent No.: US 7,928,638 B2
(45) Date of Patent: Apr. 19, 2011

(54) ELECTROMECHANICAL ACTUATORS

(76) Inventor: Ashok J. Maliakal, Westfield, NJ (US)

( * ) Notice: Subject to any disclaimer, the term of this patent is extended or adjusted under 35 U.S.C. 154(b) by 233 days.

(21) Appl. No.: 12/165,626

(22) Filed: Jun. 30, 2008

(65) Prior Publication Data

US 2009/0322182 A1 Dec. 31, 2009

(51) Int. Cl.
*H01L 41/18* (2006.01)
(52) U.S. Cl. ........................................ 310/358; 310/800
(58) Field of Classification Search .................. 310/328, 310/358, 800
See application file for complete search history.

(56) References Cited

U.S. PATENT DOCUMENTS

| | | | |
|---|---|---|---|
| 3,635,016 A | 1/1972 | Benson | 60/23 |
| 4,917,579 A * | 4/1990 | Torma | 417/322 |
| 6,096,453 A * | 8/2000 | Grunwald | 429/212 |
| 7,369,396 B2 | 5/2008 | Maliakal | 361/311 |
| 2003/0209768 A1 | 11/2003 | Milligan | |
| 2005/0034993 A1* | 2/2005 | Gozdz et al. | 205/57 |
| 2005/0046313 A1* | 3/2005 | Basheer et al. | 310/800 |

OTHER PUBLICATIONS

Wang et al., "High Dielectric Constant Composite of P(VDF-TrfE) with Grafted Copper Phthalocyanine Oligomer", macromolecules, vol. 37, pp. 2294-2298.*
2009, ASTM E111-04 "Standard Test Method for Young's modulus, Tangent modulus and Chord modulus"; Abstract only, downloaded from http://www.astm.org/Standards/E111.htm; 3 pp.
2009, ASTM D-4496-04e1 "Standard Test Method for D-C Resistance or Conductance of Moderately Conductive Materials"; Abstract only, downloaded from http://www.astm.org/Standards/D4496.htm; 2 pp.
Jinsong Liu et al., "Tuning the Electrical Conductivity and Self-Assembly of Regioregular Polythiophene by Block Copolymerization: Nanowire Morphologies in New Di- and Triblock Copolymers", *Angew. Chem. Int. Ed.*, vol. 41, No. 2, pp. 329-332 (2002).
2002, Jinsong Liu et al., "End Group Modification of Regioregular Polythiophene through Postpolymerization Functionalization," Macromolecules 2002, vol. 35, pp. 9882-9889.
1998, Zhang et al., "Giant Electrostriction and Relaxor Ferroelectric Behavior in Electron-Irradiated Poly(vinylidene fluoride-trifluoroethylene) Copolymer," Science, vol. 280, pp. 2101-2104.
2002, Zhang et al., "An all-organic composite actuator material with a high dielectric constant," Nature, vol. 419, pp. 284-287.
Pelrine et al., "High-Speed Electrically Actuated Elastomers with Strain Greater Than 100%," Science, vol. 287, pp. 836-839 (2000).
Jun. 14, 2008, "Dielectric Constant and Dissipation Factor", downloaded from http://www.ptli.com/testlopedia/tests/D150Dielectric.asp, 2 pp.
Jun. 14, 2008, "Permittivity", downloaded from http://en.wikipedia.org/wiki/Permittivity; 6 pp.
Jun. 14, 2008, "Young's Modulus," downloaded from http://en.wikipedia.org/wiki/Young's_modulus; 3 pp.
Wang et al., "Microstructure and Dielectric Properties of P(VDF-TrFE-CFE) with Partially Grafted Copper Phthalocyanine Oligomer," Macromolecules vol. 38, pp. 2247-2252 (2005).

(Continued)

*Primary Examiner* — Derek J Rosenau
(74) *Attorney, Agent, or Firm* — Jay M. Brown

(57) ABSTRACT

Apparatus including layer of polarizable material located between first and second electrodes. Polarizable material has block copolymeric composition including elastomeric domain blocks and conductive domain blocks. Method that includes providing layer of polarizable material having block copolymeric composition including elastomeric domain blocks and conductive domain blocks, first and second electrodes being on opposite surfaces of the layer. Method also includes applying voltage differential between electrodes, causing dimension of layer to change.

20 Claims, 4 Drawing Sheets

OTHER PUBLICATIONS

2004, Wang et al., "High Dielectric Constant Composite of P(VDF-TrFE) with Grafted Copper Phthalocyanine Oligomer," Macromolecules, vol. 37, pp. 2294-2298; (Abstract only).

Carpi et al., "Silicone-Poly(hexylthiophene) Blends as Elastomers with Enhanced Electromechanical Transduction Properties," 2008 Advanced Functional Materials, vol. 18, pp. 235-241.

Pelrine, et al., "High-Field Deformation of Elastomeric Dielectrics for Actuators," 2000, Materials Science and Engineering C, vol. 11, pp. 89-100.

"Source-based nomenclature for copolymers", Pure Appl. Chem., (1985), vol. 57, pp. 1427-1440, (14pp.): downloaded on Aug. 19, 2010 at http://media.iupac.org/publications/pac/1985/pdf/5710x1427.pdf.

"Source-based nomenclature for copolymers," 20 pp., republished on May 18, 2001 as IUPAC Purple Book I, Chapter 7, so cited on Aug. 19, 2010 at at http://www.Iupac.org/web/ins/2002-048-1-400 and downloaded on Aug. 19, 2010 at http://www.iupac.org/publications/books/pbook/PurpleBook-C7.pdf).

\* cited by examiner

ELECTROMECHANICAL ACTUATORS

BACKGROUND OF THE INVENTION

1. Field of the Invention

This invention generally relates to electromechanical actuators, and methods of implementing electromechanical actuators.

2. Related Art

This section introduces aspects that may help facilitate a better understanding of the invention. Accordingly, the statements of this section are to be read in this light and are not to be understood as admissions about what is prior art or what is not prior art.

Various types of electromechanical actuators have been developed. Electromechanical actuators having a variety of performance properties are needed for diverse end-use applications. Electromechanical actuators are intended to have features such as sufficient structural integrity to facilitate repeated actuations without undergoing permanent deformation, sufficient electrical permittivity for actuation, and sufficient sensitivity to enable actuation under applied voltages that do not cause excessive heating. Providing these and other features in an electromechanical actuator has presented challenges to fabricators.

SUMMARY

In an example of an implementation, an apparatus is provided. The apparatus includes first and second electrodes and a layer of a polarizable material located between the electrodes. The polarizable material has a block copolymeric composition including elastomeric domain blocks and conductive domain blocks. The layer of the polarizable material may be, as an example, located to change a dimension of the layer in response to application of a voltage differential between the first and second electrodes.

As another example of an implementation, a method is provided. The method includes providing a layer of a polarizable material having a block copolymeric composition including elastomeric domain blocks and conductive domain blocks, the layer being between first and second electrodes on opposite surfaces of the layer. The method additionally includes applying a voltage differential between the first and second electrodes, causing a dimension of the layer to change. In an example, causing the dimension of the layer to change may include causing a layer thickness to decrease. As another example, causing the dimension to change may include causing a dimension of each of the two opposite surfaces to increase. As a further example, the method may include utilizing the change in the layer dimension to move a fluid or an object.

Other apparatus, methods, features and advantages of the invention will be or will become apparent to one with skill in the art upon examination of the following figures and detailed description. It is intended that all such additional apparatus, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the examples of implementations. Moreover, in the figures, like reference numerals designate corresponding parts throughout the different views.

DETAILED DESCRIPTION

Electromechanical actuators capable of converting electrical energy into mechanical energy are needed for a wide range of end-use applications including, as examples, mini- and micro-robots, micro air vehicles, flat-panel loudspeakers, micro-electromechanical systems (MEMS), micro-motors, disk drives, prosthetic devices, and micro-fluidic devices. Electromechanical actuators are provided herein, which may satisfy a plurality of high-performance criteria including, as examples, large ranges of mobility at high precision and speed, high elastic energy density, high electrical permittivity for actuation at a moderate voltage differential, and low mechanical fatigue rates for durability and reliability. Further herein, methods for carrying out electromechanical actuation are provided.

Figure 1:
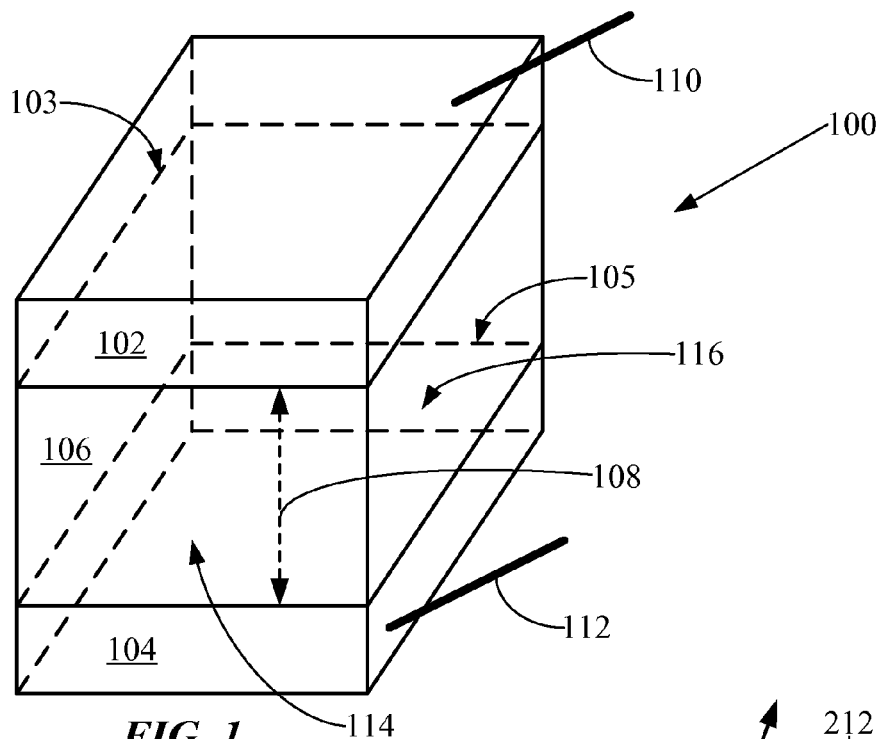
FIG. 1 is a perspective view showing an example of an implementation of an apparatus.

FIG. 1 is a perspective view showing an example 100 of an implementation of an apparatus. The apparatus 100 includes a first electrode 102 and a second electrode 104. Further, the apparatus 100 includes a layer 106 of a polarizable material, located between the first and second electrodes 102, 104. The layer 106 of the polarizable material has a thickness represented by the arrow 108 between two opposing surfaces 103, 105, which may for example be an average thickness. The layer 106 of the polarizable material has a block copolymeric composition including elastomeric domain blocks and conductive domain blocks. In the block copolymeric composition, the elastomeric domain blocks physically interrupt the conductive domain blocks such that the conductive domain blocks cannot span the thickness 108 to form an electrically conductive path between the first and second electrodes 102, 104.

The following conventions are understood throughout this specification. A "layer" designates a body of a material however formed, which as examples may be constituted as a unitary layer or may include a plurality of sub-layers. When a first layer is referred to as being "on" a second layer, the first layer may cover the entire surface of the second layer or only a portion of the surface of the second layer. Terms such as "formed on" are not intended to introduce any limitations relating to particular methods of layer fabrication such as material transport, deposition, fabrication, surface treatment, or physical, chemical or ionic bonding or interaction.

In examples, the layer 106 of a polarizable material may have an average thickness 108, in a neutral state, within a range of between about 10 micrometers and about 200 micrometers. Herein, the neutral state refers to a state in which no voltage differential is applied across the two electrodes 102, 104 on opposite sides 103, 105 of the layer 106 of the polarizable material.

As examples, each of the first and second electrodes 102, 104 may themselves have a thickness, measured in the same directions as represented by the arrow 108, of about 25 micrometers or less.

The first and second electrodes 102, 104 and the layer 106 of polarizable material may, as an example, be configured together to form a parallel-plate capacitor. In some examples, the layer 106 of the polarizable material may be located between the first and second electrodes 102, 104 such that the layer thickness 108 changes in response to application or removal of a voltage differential between the first and second electrodes 102, 104. In an example, the first and second electrodes 102, 104 may be formed of a composition including an electrically-conductive carbon grease. Suitable electrically-conductive carbon grease compositions may be commercially available, for example, from ITW Chemtronics of Kennesaw, Ga., U.S.A.

Figure 2:
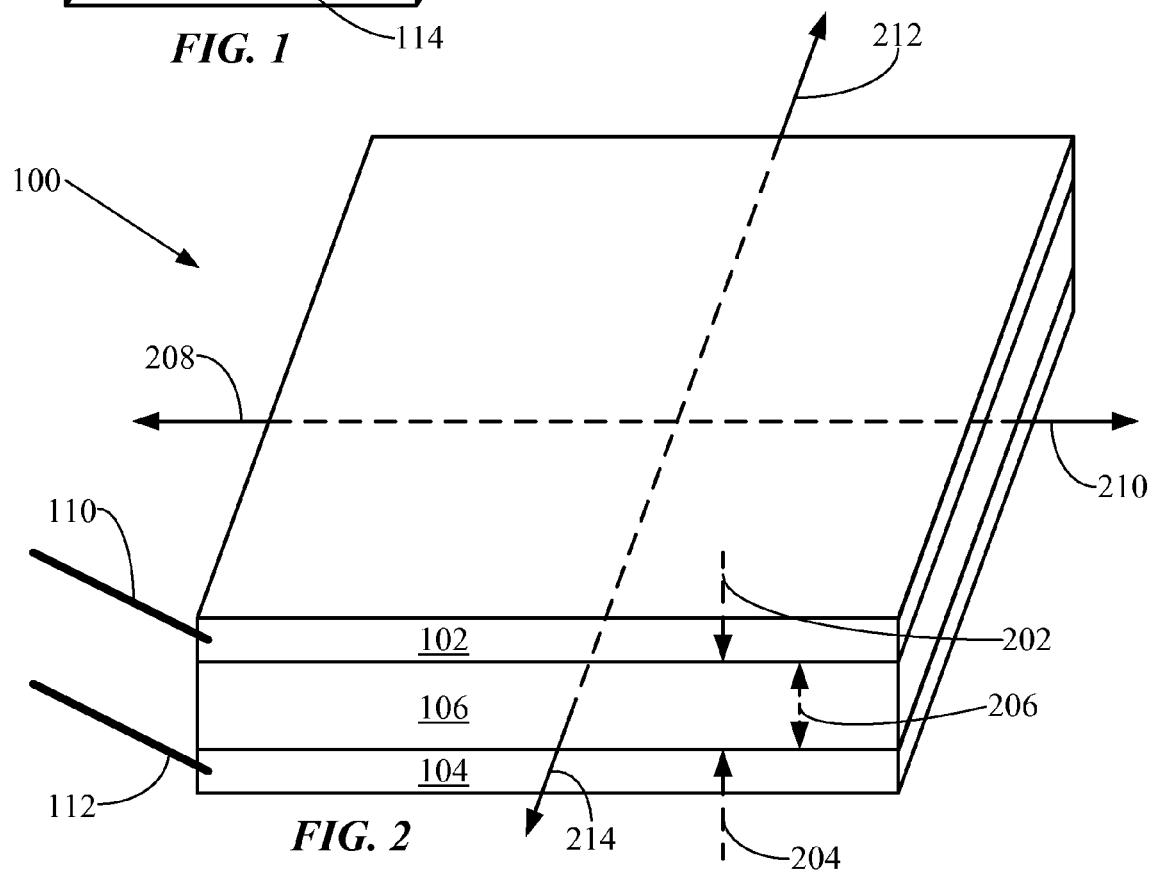
FIG. 2 is another perspective view showing the example of the apparatus of FIG. 1.

In operation of the example 100 of an apparatus, the first and second electrodes 102, 104 may be connected by conductors 110, 112 into an external circuit (not shown) having a voltage source. FIG. 1 may represent the example 100 of an apparatus in a neutral state where the external circuit is not energized. FIG. 2 is another perspective view showing the example 100 of the apparatus of FIG. 1. FIG. 2 may represent the example 100 of an apparatus in an actuated state where the external circuit is energized for application of a voltage differential between the first and second electrodes 102, 104. As shown in FIG. 2, for example, the applied voltage differential may cause the layer 106 of the polarizable material to contract in the directions represented by the arrows 202, 204. When the voltage differential is removed, the apparatus 100 may return to the neutral state as shown in FIG. 1. Accordingly, in the example 100 of an apparatus, the layer 106 of the polarizable material may have, as shown in FIG. 2, an average layer thickness 206 which is smaller than the average layer thickness 108 as shown in FIG. 1. Further as shown in FIG. 2, for example, the applied voltage differential may cause the layer 106 of the polarizable material to be transversely stretched by expansion in one or more of the directions represented by the arrows 208, 210, 212, 214. In an example, one or more edges 114, 116 of the layer 106 of the polarizable material may be restrained from expansion by a barrier (not shown). Accordingly, transverse stretching of the layer 106 of polarizable material in response to application of a voltage differential between the first and second electrodes 102, 104 may be confined to, as examples: directions 208 and 210; directions 212 and 214; or one of the directions 208-214. Both the thickness reduction and the transverse stretching, in changing dimensions of the apparatus 100, serve to convert electrical energy into mechanical energy and facilitate utilization of the apparatus 100 as an electromechanical actuator. For example, the thickness reduction of the layer 106 may be utilized to produce a displacement of the apparatus 100 in either or both of the directions 202, 204, while the transverse stretching of the layer 106 may be utilized to produce a displacement of the apparatus 100 in one or more of the directions 208-214. In end-use examples, the contraction and resulting displacement in one or both of the directions 202, 204, or the transverse stretching by expansion in one or more of the directions 208-214, or both, may be utilized to move a fluid or an object (not shown). For example, such an object (not shown) may be a component of a device such as a mini- or micro-robot, a micro air vehicle, a flat-panel loudspeaker, a micro-electromechanical system (MEMS), a micro-motor, a disk drive, a prosthetic device, or a micro-fluidic device.

The block copolymeric composition of the layer 106 of polarizable material, which includes elastomeric domain blocks and conductive domain blocks, may for example be selected to have an increased stored elastic energy density, $U_S$, when the apparatus 100 is actuated. The elastic energy density is related to both the stress and strain generation capability of an electromechanical actuator. For an electromechanical actuator having substantially linear dielectric and elastic properties, the stored elastic energy density, $U_S$, may for example be expressed by Formula (I), as follows:

$$U_s = \frac{1}{2}YS^2 = \frac{(K\varepsilon_0 E^2)^2}{2Y} \qquad (1)$$

where Y is the Young's modulus in Pascals, S is the unit-less strain, K is the material's unit-less dielectric constant, E is the magnitude of the electric field in volts per meter (V/m), and $\varepsilon_0$ is the vacuum dielectric permittivity, $8.85 \times 10^{-12}$ Farads per meter (F/m).

Further, the elastomeric domain blocks of the block copolymeric composition of the layer 106 of polarizable material may for example be selected to include elastomeric oligomers. As examples, the elastomeric oligomers may include monomers selected from acrylates, siloxanes, urethanes, and olefins. For example, acrylates may include butylacrylates. As another example, olefins may include butadienes, isoprenes, and isobutylenes. In an example, elastomeric oligomers may be selected having a characteristic Young's modulus of less than about one giga-Pascal. Young's modulus is a measure of the stiffness of a material, and is defined as the ratio of tensile stress in units of pressure, over unit-less tensile strain, in the region in which Hooke's Law is obeyed for the material. Young's modulus may be experimentally determined from the slope of a stress-strain curve created during tensile tests carried out on a sample of a material. It is understood throughout this specification that a Young's modulus of elastomeric oligomers may be determined by preparing a polymerized body of the elastomeric oligomers, and testing the polymerized body of elastomeric oligomers in accordance with the current version of ASTM E111-04 "Standard Test Method for Young's modulus, Tangent modulus and Chord modulus", the entirety of which hereby is incorporated herein by reference.

In addition, the conductive domain blocks of the block copolymeric composition of the layer 106 of polarizable material may for example be selected to include conductive oligomers. As examples, the conductive oligomers may include monomers selected from: thiophenes, alkynes, pyrroles, anilines, fluorones, and phenylene sulfides. Polythiophenes may for example include poly 3-alkyl thiophenes. Polyalkynes may include, for example, polyacetylenes. In an example, conductive oligomers may be selected having a characteristic bulk conductivity within a range of between about $1 \times 10^{-2}$ Siemens per centimeter (S/c) and about $1 \times 10^4$ S/c. It is understood throughout this specification that a bulk conductivity of conductive oligomers may be determined by preparing a polymerized body of the conductive oligomers, and testing the polymerized body of conductive oligomers in accordance with the current version of ASTM D-4496-04e1 "Standard Test Method for D-C Resistance or Conductance of Moderately Conductive Materials", the entirety of which hereby is incorporated herein by reference.

The elastomeric and conductive domain blocks of the composition of the layer 106 of polarizable material are included in a block copolymer. For example, each elastomeric domain block may be formed by an elastomeric oligomer, and each conductive domain block may be formed by a conductive oligomer. In an example, the block copolymer may be a comb copolymer, having a backbone including the elastomeric domain blocks and having teeth bound at spaced apart positions on the backbone, the teeth including the conductive domain blocks. The block copolymer may be a di-block copolymer including the elastomeric domain blocks and the conductive domain blocks, and may include additional copolymerizates in block- or non-block structural form. Variations in co-polymerization of the elastomeric and conductive domain blocks are contemplated. Such variations may include, as examples, co-polymerization of monomers, oligomers, and/or polymers together with the elastomeric and conductive domain blocks; pre-polymerization of the elastomeric or conductive domain blocks followed by their co-polymerization; cross-linking of the elastomeric and conductive domain blocks; ligand bonding onto the elastomeric and conductive domain blocks; and/or other chemical reactions with the elastomeric and conductive domain blocks. Block copolymers may include, as examples, linear- and branched-chain block copolymers, alternating block copolymers, and other types of block copolymers. In an example, the composition of the layer 106 may have conductive domain blocks each including an average number of monomers sufficiently numerous to generate detectable internal electrical conductivity within the layer 106. This internal conductivity within the layer 106 may, as an example, reduce a minimum voltage differential between the first and second electrodes 102, 104 sufficient for changing a dimension of the layer 106. It is understood throughout this specification that a monomer is a smallest repeating unit within an elastomeric domain block or a conductive domain block. As another example, the composition of the layer 106 may have conductive domain blocks each including an average of about twenty-five (25) or more monomers. In a further example, the composition of the layer 106 may have elastomeric domain blocks each including an average number of monomers sufficiently numerous such that breakdown shorting does not occur between the first and second electrodes 102, 104 upon application of a voltage differential sufficient for changing a layer dimension.

The layer 106 of polarizable material may, for example, have a large dielectric constant so that the first and second electrodes 102, 104 and the layer 106 may together form a parallel plate capacitor with a large capacitance. In an example, the layer 106 of polarizable material may have a dielectric constant greater than about 8 measured at 1,000 Hertz.

The low Young's modulus of the elastomeric domain blocks contributes mechanical flexibility to the layer 106, reducing the minimum strength of an electric field needed for placing the apparatus 100 in an actuated state. Hence, the minimum voltage differential needed between the first and second electrodes 102, 104 to generate such an electric field is likewise reduced by using such elastomeric domain blocks. The high bulk conductivity of the conductive domain blocks may reduce a minimum applied voltage differential needed to generate an electric field of sufficient strength for actuation of the apparatus 100. The combination of the elastomeric domain blocks with the conductive domain blocks additionally causes the apparatus 100 to have a high dielectric constant.

The block copolymeric composition in the layer 106 of polarizable material including elastomeric and conductive domain blocks may, for example, be synthesized by atom transfer radical polymerization of a suitable elastomeric monomer such as butyl acrylate, together with an appropriately end-functionalized conductive oligomer, such as a poly(thiophene) oligomer. Suitable atom transfer radical polymerization techniques are disclosed, for example, in Jinsong Liu et al., "Tuning the Electrical Conductivity and Self-Assembly of Regioregular Polythiophene by Block Copolymerization Nanowire Morphologies in New Di- and Triblock Copolymers", Angew. Chem. Int. Ed., Vol. 41, No. 2, pp. 329-332 (2002), the entirety of which hereby is incorporated herein by reference.

Figure 3:
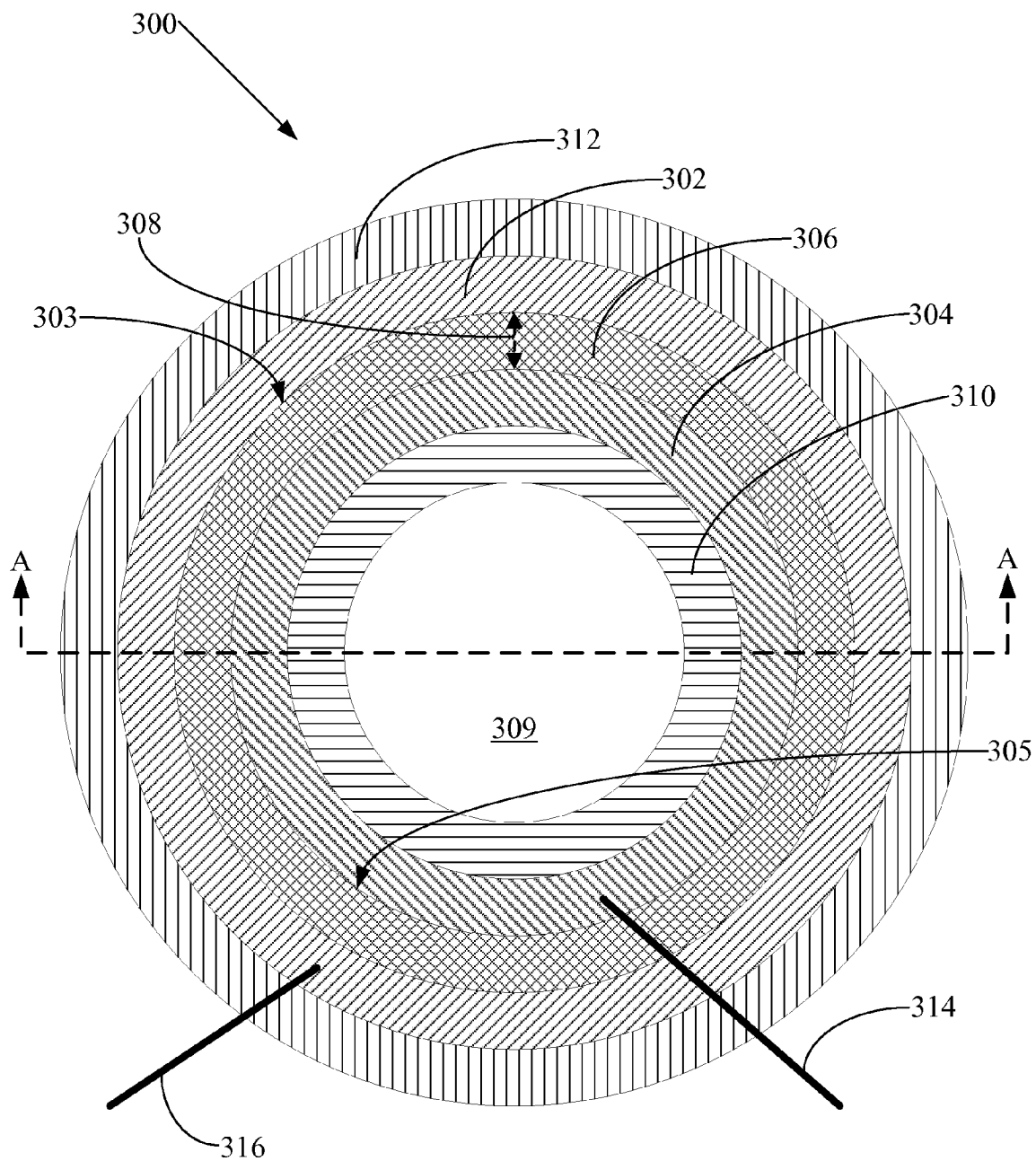
FIG. 3 is a radial cross-sectional view showing an example of an implementation of another apparatus.

FIG. 3 is a radial cross-sectional view showing an example 300 of an implementation of another apparatus. The apparatus 300 includes a first electrode 302 and a second electrode 304. Further, the apparatus 300 includes a layer 306 of a polarizable material, located between the first and second electrodes 302, 304. The layer 306 of polarizable material has a thickness represented by the arrow 308 between two opposing surfaces 303, 305, which may for example be an average thickness. The layer 306 of polarizable material has a block copolymeric composition including elastomeric domain blocks and conductive domain blocks. The first and second electrodes 302, 304 and the layer 306 of the polarizable material may, for example, have mutually concentric shapes that define an inner channel 309. As an example, the mutually concentric shapes and the inner channel 309 may be cylindrical or rhomboid.

Figure 4:
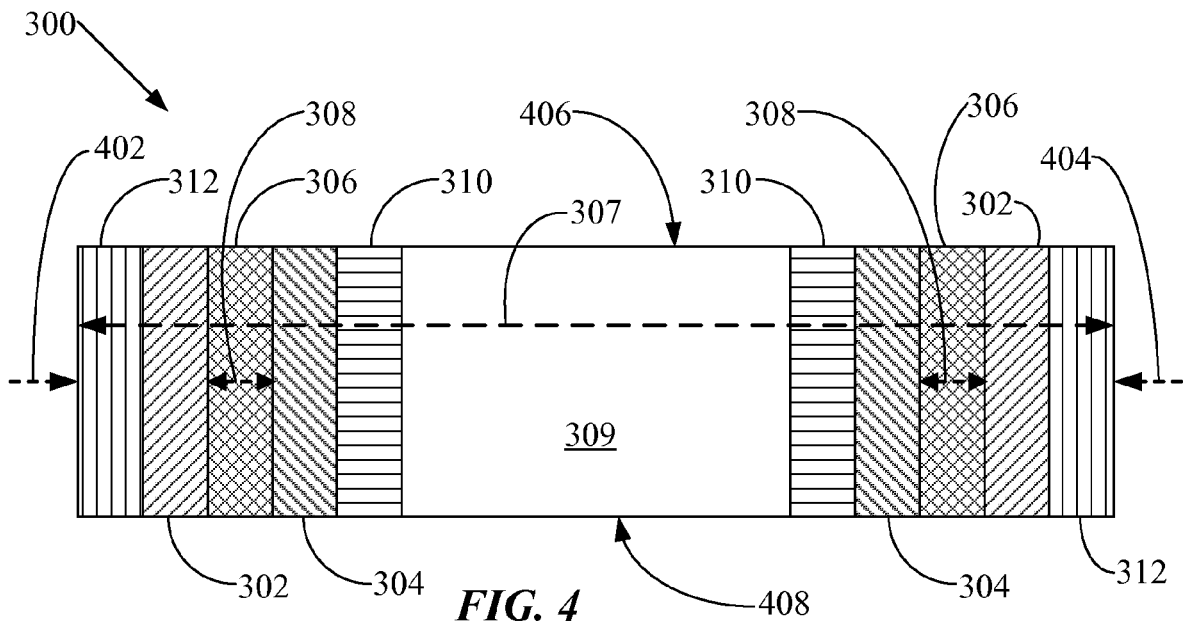
FIG. 4 is an axial cross-sectional view taken along line A-A showing the apparatus of FIG. 3.

FIG. 4 is an axial cross-sectional view taken along line A-A showing the apparatus 300 of FIG. 3. As shown in FIG. 4, the apparatus 300 includes the first and second electrodes 302, 304, and the layer 306 of polarizable material, located between the first and second electrodes 302, 304. FIG. 4 further shows that the first and second electrodes 302, 304 and the layer 306 of the polarizable material may, for example, have mutually concentric shapes that define the inner channel 309.

The layer 306 of polarizable material may, for example, be located between the first and second electrodes 302, 304 to change a dimension of the layer 306 in response to application or removal of a voltage differential between the first and second electrodes 302, 304. For example, the thickness 308 of the layer 306 may be reduced. In an example, the first and second electrodes 302, 304 may have a composition including an electrically-conductive carbon grease.

In another example, the apparatus 300 may include an internal dielectric layer 310. The internal dielectric layer 310 may electrically isolate the electrode 304 from the inner channel 309. In another example, the apparatus 300 may include an external dielectric layer 312. The external dielectric layer 312 may electrically isolate the electrode 302.

Figure 5:
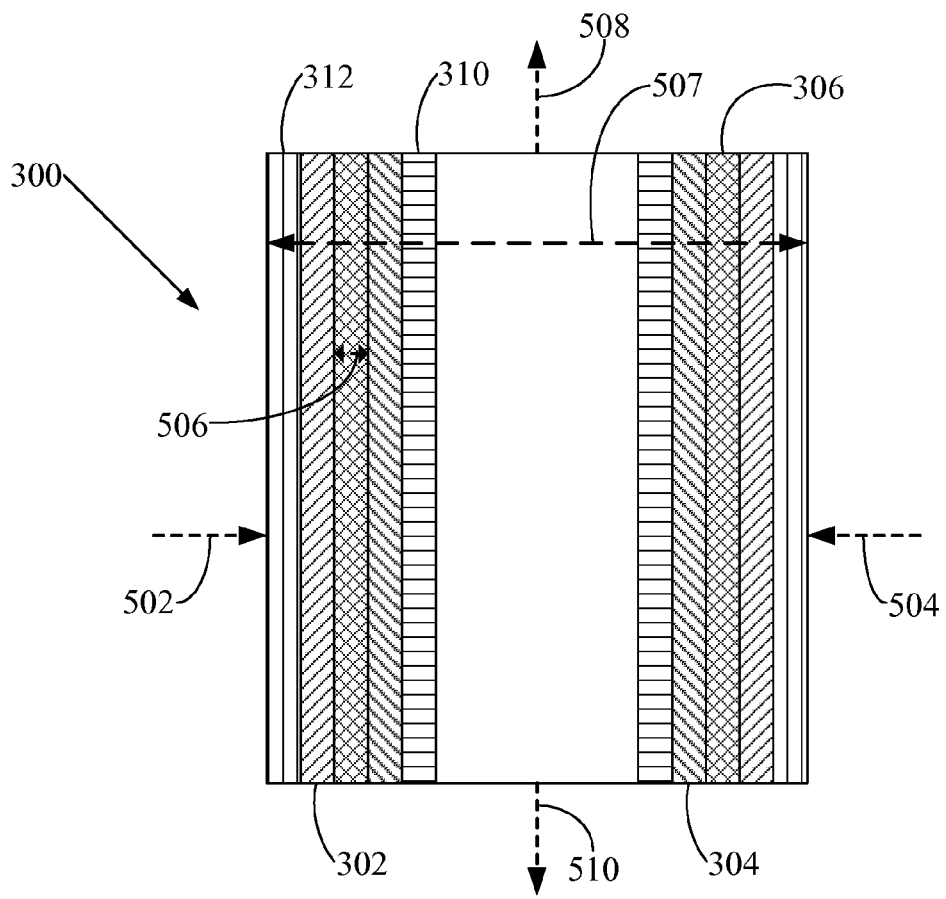
FIG. 5 shows the example of the apparatus of FIGS. 3-4 taken along line A-A where an external circuit is energized for application of a voltage differential between first and second electrodes.

In operation of the example 300 of an apparatus, the first and second electrodes 302, 304 may be connected by conductors 314, 316 into an external circuit (not shown) having a voltage source. FIGS. 3 and 4 may represent the example 300 of an apparatus where the external circuit is in a neutral state and the electrodes 302, 304 are not energized. FIG. 5 shows the example 300 of the apparatus of FIGS. 3-4 taken along the line A-A in an actuated state where an external circuit is energized for application of a voltage differential between first and second electrodes 302, 304. As shown in FIG. 5, for example, the applied voltage differential may cause the layer 306 of the polarizable material to contract in the directions represented by the arrows 502, 504. When the voltage differential is removed, the apparatus 300 may return to a neutral state as shown in FIGS. 3 and 4. Accordingly, the example 300 of an apparatus may have, as shown in FIG. 5, an average layer thickness 506 of the layer 306 which is smaller than the average layer thickness 308. In addition, for example, a diameter represented by an arrow 507 of the apparatus 300 in the actuated state may be smaller than a diameter, represented by an arrow 307, of the apparatus 300 in a neutral state. Further as shown in FIG. 5, for example, the applied voltage differential may cause the layer 306 of the polarizable material to be axially stretched by extension in either or both of the directions represented by the arrows 508, 510. As another example, one of the edges 406, 408 of the layer 306 of the polarizable material may be restrained from axial stretching by a barrier (not shown). Accordingly, axial stretching of the layer 306 of the polarizable material in response to application of a voltage differential between the first and second electrodes 302, 304 may be confined to expansion in one of the directions 508, 510. Both the average layer thickness reduction and diameter reduction, and the axial stretching of the shape of the apparatus 300, convert electrical energy into mechanical energy by changing a dimension of the layer 306, and facilitate utilization of the apparatus 300 as an electromechanical actuator.

For example, the average layer thickness reduction may be utilized to compress a fluid (not shown) contained by the inner channel 309. Compression of such a fluid may, as examples, propel the fluid in either or both of the directions 508, 510. Additionally, for example, the diameter reduction in the apparatus 300 may be utilized to so compress a fluid for movement of an object (not shown), or in operation of a fluid valve. For example, the apparatus 300 may be connected to input and output ports (not shown) and configured with valves (not shown) to form a micro-fluidic pump. Further, for example, the axial stretching may be utilized to produce a displacement of the apparatus 300 itself in either or both of the directions 508, 510. In end-use examples, the diameter reduction in directions of the arrows 402, 404, or the axial stretching of the apparatus 300 in either or both of the directions 508, 510, may be utilized to move an object (not shown). For example, such an object (not shown) may be a component of a device such as a mini- or micro-robot, a micro air vehicle, a flat-panel loudspeaker, a micro-electromechanical system (MEMS), a micro-motor, a disk drive, a prosthetic device, or a micro-fluidic device.

The block copolymeric composition of the layer 306 of polarizable material, which includes elastomeric domain blocks and conductive domain blocks, may for example be selected to have a high stored elastic energy density, $U_S$, in the actuated state as discussed earlier in connection with the apparatus 100. The elastomeric domain blocks of the block copolymeric composition of the layer 306 of polarizable material may for example be selected to include elastomeric oligomers, in the same manner as discussed earlier in connection with the apparatus 100. In addition, the conductive domain blocks of the block copolymeric composition of the layer 306 of polarizable material may for example be selected to include conductive oligomers, in the same manner as discussed earlier in connection with the apparatus 100. In examples, the block copolymer may include the same variations in structure as discussed earlier in connection with the layer 106 of the apparatus 100. For example, the layer 306 may have a composition including a comb copolymer, having a backbone including the elastomeric domain blocks and having teeth bound at spaced apart positions on the backbone, the teeth including the conductive domain blocks. Block copolymers may further include, as examples, linear- and branched-chain block copolymers, alternating block copolymers, and other types of block copolymers.

In an example, the composition of the layer 306 may have conductive domain blocks each including an average number of monomers sufficiently numerous to generate detectable internal electrical conductivity within the layer 306. This internal conductivity within the layer 306 may, as an example, reduce a minimum voltage differential between the first and second electrodes 302, 304 sufficient for changing a dimension of the layer 306. As another example, the composition of the layer 306 may have conductive domain blocks each including an average of about twenty-five (25) or more monomers. In a further example, the composition of the layer 306 may have elastomeric domain blocks each including an average number of monomers sufficiently numerous such that breakdown shorting does not occur between the first and second electrodes 302, 304 upon application of a voltage differential sufficient for changing a layer dimension.

Further, the layer 306 of polarizable material may, for example, be configured to form a parallel plate capacitor together with the first and second electrodes 302, 304. In an example, the layer 306 of polarizable material may have a dielectric constant greater than about 10 measured at 1,000 Hertz.

Figure 6:
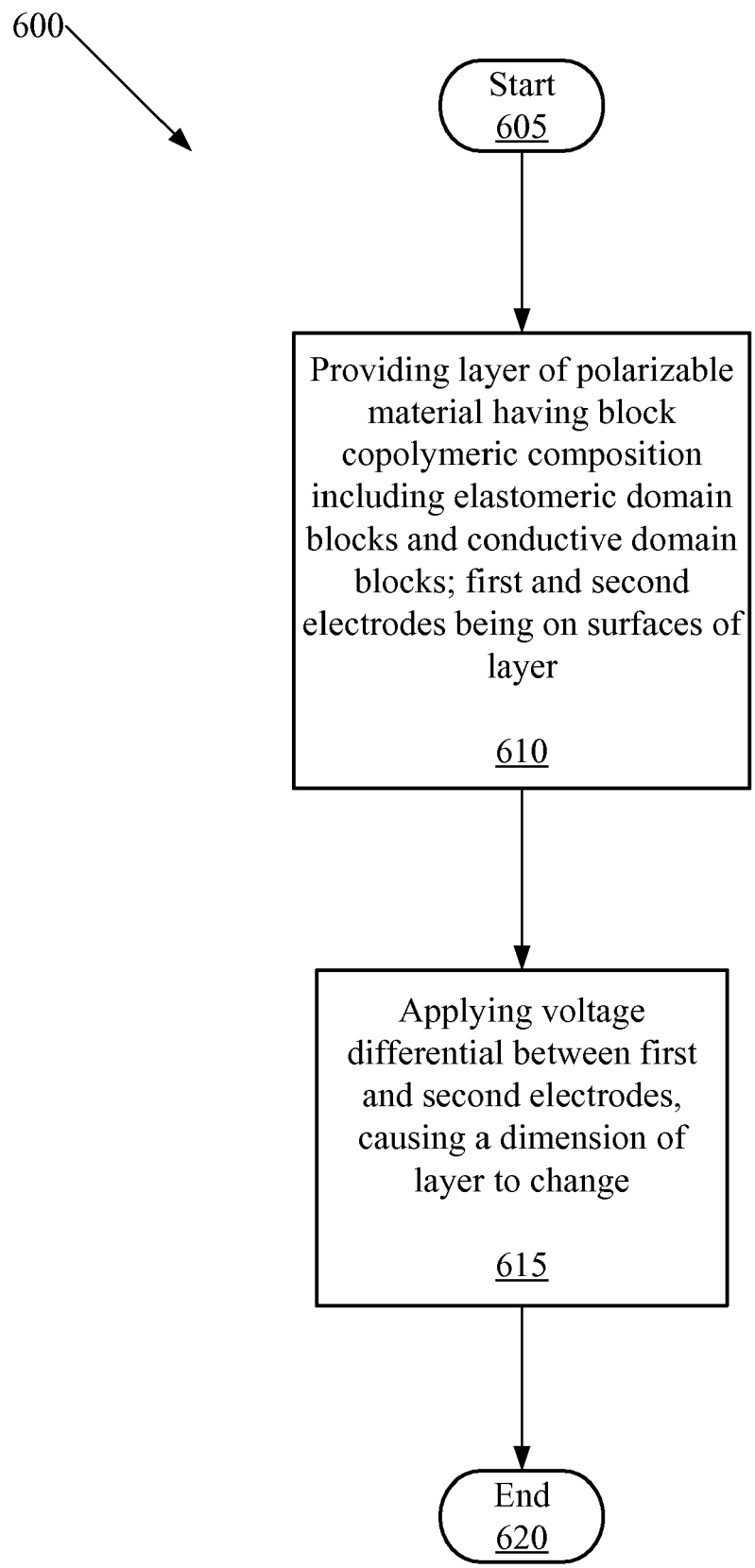
FIG. 6 is a flow chart showing an example of an implementation of a method.

FIG. 6 is a flow chart showing an example of an implementation of a method 600. The method starts at step 605. Step 610 includes providing a layer 106, 306 of a polarizable material having a block copolymeric composition including elastomeric domain blocks and conductive domain blocks; a first electrode 102, 302 being on a surface 103 of the layer 106, 306; and a second electrode 104, 304 being on another surface 105, 305 of the layer 106, 306. The layer may, for example, have a thickness 108, 308 between two opposing surfaces 103, 105, 303, 305. Step 615 includes applying a voltage differential between the first and second electrodes 102, 104, 302, 304, causing a dimension of the layer to change. The method may then end at step 620.

In an example, step 610 may include selecting elastomeric domain blocks including elastomeric oligomers, where the elastomeric oligomers have a characteristic Young's modulus of less than about one giga-Pascal. As another example, step 610 may include selecting elastomeric domain blocks including elastomeric oligomers of monomers selected from acrylates, siloxanes, urethanes, and olefins. As an additional example, step 610 may include selecting conductive domain blocks including conductive oligomers having a bulk conductivity within a range of between about $1 \times 10^{-2}$ S/c and about $1 \times 10^4$ S/c. Further, for example, step 610 may include selecting conductive domain blocks including conductive oligomers of monomers selected from thiophenes, alkynes, pyrroles, anilines, fluorones, and phenylene sulfides.

As an example, step 610 may include providing the first and second electrodes 102, 104, 302, 304 and the layer 106, 306 configured as a parallel-plate capacitor. As another example, step 610 may include providing the first and second electrodes 302, 304 and the layer 306 of polarizable material with mutually concentric shapes that together define an inner channel 309.

In another example, step 615 may include causing the average layer thickness 108, 308 to be decreased and causing a dimension of each of the two surfaces 103, 105, 303, 305 to be increased. Further, for example, step 615 may include utilizing the change in the average layer thickness 108, 308 to move a fluid or an object. Where step 610 includes providing an inner channel 309, step 615 may as an example include propelling fluid along the inner channel 309 in response to the application of the voltage differential.

For the purposes of this specification, a MEMS device is a device having two or more parts adapted to move relative to one another, where the motion is based on a mechanical reaction to an electrical control signal. MEMS devices are fabricated using conventional micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. Examples of MEMS devices include, without limitation, MOEMS (micro-opto-electromechanical systems) devices and micro-electromechanical machines.

The apparatus 100, 300 may generally be utilized as electromechanical actuators. The apparatus 100, 300 may, for example, be utilized together with conductors 110, 112, 314, 316 suitable for applying a voltage differential to the electrodes 102, 104, 302, 304; and may include additional structural elements configured for directing and receiving the movement occurring upon actuation. Likewise, the method 600 may be utilized in connection with operating a suitable apparatus including a layer of polarizable material having a block copolymeric composition including elastomeric domain blocks and conductive domain blocks between first and second electrodes, of which the apparatus 100, 300 are only examples. The above teachings with regard to the apparatus 100 are applicable in an analogous manner to the apparatus 300; and the above teachings with regard to the apparatus 300 are applicable in an analogous manner to the apparatus 100. The above teachings with regard to the method 600 are applicable in an analogous manner to the apparatus 100, 300; and the above teachings with regard to the apparatus 100, 300 are applicable in an analogous manner to the method 600. The above discussions as to each of the apparatus 100, the apparatus 300, and the method 600 accordingly are deemed incorporated into all of the above discussions of the method 600 and of both of the apparatus 100, 300. While the foregoing description refers in some instances to the apparatus 100, 300, it is appreciated that the subject matter is not limited to these structures, nor to the structures discussed in the specification. Other configurations of apparatus may be utilized consistent with the teachings herein. Likewise, the method 600 may include additional steps and modifications of the indicated steps.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. An apparatus, comprising:
   first and second electrodes; and
   a layer of a polarizable material located between the first and second electrodes;
   wherein the polarizable material has a composition that includes a block copolymer having elastomeric domain blocks in linear arrangement with conductive domain blocks.

2. The apparatus of claim 1, wherein the first and second electrodes and the layer of the polarizable material, are configured together to form a parallel-plate capacitor.

3. The apparatus of claim 1, wherein the layer of the polarizable material is located to change a dimension of the layer of the polarizable material in response to application of a voltage differential between the first and second electrodes.

4. The apparatus of claim 1, wherein the first and second electrodes and the layer of the polarizable material have mutually concentric shapes that define an inner channel; and wherein the apparatus is adapted to propel fluid along the inner channel in response to an application of a voltage differential between the first and second electrodes.

5. The apparatus of claim 1, wherein the elastomeric domain blocks include elastomeric oligomers, and wherein the elastomeric oligomers have a characteristic Young's modulus of less than about one giga-Pascal.

6. The apparatus of claim 1, wherein the elastomeric domain blocks include elastomeric oligomers selected from a group consisting of: acrylates, siloxanes, urethanes, and olefins.

7. The apparatus of claim 1, wherein the conductive domain blocks include conductive oligomers, and wherein the conductive oligomers have a bulk conductivity within a range of between about $1 \times 10^{-2}$ Siemens per centimeter and about $1 \times 10^4$ Siemens per centimeter.

8. The apparatus of claim 1, wherein the conductive domain blocks include conductive oligomers selected from a group consisting of: thiophenes, alkynes, pyrroles, anilines, fluorones, and phenylene sulfides.

9. The apparatus of claim 1, wherein the conductive domain blocks each include an average of about twenty-five (25) or more monomers.

10. The apparatus of claim 1, wherein the block copolymer includes a di-block copolymer formed by elastomeric domain blocks together with the conductive domain blocks.

11. The apparatus of claim 1, wherein the polarizable material has a dielectric constant greater than about 10 measured at 1,000 Hertz.

12. A method, comprising:
    providing a layer of a polarizable material having a composition that includes a block copolymer having elastomeric domain blocks in linear arrangement with conductive domain blocks, first and second electrodes being on opposite surfaces of the layer of the polarizable material; and
    applying a voltage differential between the first and second electrodes, causing a dimension of the layer of the polarizable material to change.

13. The method of claim 12, wherein the first and second electrodes and the layer of the polarizable material are configured together to form a parallel-plate capacitor.

14. The method of claim 12, wherein the applying causes a thickness of the layer of the polarizable material to decrease, and causes a dimension of each of the two opposite surfaces to increase.

15. The method of claim 12, including utilizing the change in the dimension of the layer of the polarizable material to move a fluid or an object.

16. The method of claim 12 wherein the first and second electrodes and the layer of the polarizable material have mutually concentric shapes defining an inner channel, and the applying causes a fluid to be propelled along the inner channel.

17. The method of claim 12, wherein the elastomeric domain blocks include elastomeric oligomers, and wherein the elastomeric oligomers have a characteristic Young's modulus of less than about one gigs-Pascal.

18. The method of claim 12, wherein the elastomeric domain blocks include elastomeric oligomers selected from a group consisting of: acrylates, siloxanes, urethanes, and olefins.

19. The method of claim 12, wherein the conductive domain blocks include conductive oligomers, and wherein the conductive oligomers have a bulk conductivity within a range of between about $1 \times 10^{-2}$ Siemens per centimeter and about $1 \times 10^4$ Siemens per centimeter.

20. The method of claim 12, wherein the conductive domain blocks include conductive oligomers selected from a group consisting of thiophenes, alkynes, pyrroles, anilines, fluorones, and phenylene sulfides.

* * * * *